US010074491B2

(12) United States Patent
Morita

(10) Patent No.: US 10,074,491 B2
(45) Date of Patent: Sep. 11, 2018

(54) RAPID MICRO ELECTRO MECHANICAL SYSTEM SWITCHING APPARATUS

(71) Applicant: Sony Corporation, Tokyo (JP)

(72) Inventor: Shinya Morita, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 15/512,285

(22) PCT Filed: Jul. 10, 2015

(86) PCT No.: PCT/JP2015/003501
§ 371 (c)(1),
(2) Date: Mar. 17, 2017

(87) PCT Pub. No.: WO2016/047011
PCT Pub. Date: Mar. 31, 2016

(65) Prior Publication Data
US 2017/0278646 A1 Sep. 28, 2017

(30) Foreign Application Priority Data
Sep. 26, 2014 (JP) ................. 2014-196096

(51) Int. Cl.
*H01H 1/00* (2006.01)
(52) U.S. Cl.
CPC ..... *H01H 1/0036* (2013.01); *B81B 2201/033* (2013.01); *B81B 2203/0136* (2013.01);
(Continued)
(58) Field of Classification Search
CPC ...... B81B 2203/051; B81B 2203/0136; B81B 2201/033; H01H 2001/0078
(Continued)

(56) References Cited

U.S. PATENT DOCUMENTS 6,975,193 B2 * 12/2005 Knieser .............. H01H 59/0009
200/181
9,123,493 B2 * 9/2015 Rogers ............... H01H 59/0009
(Continued)

FOREIGN PATENT DOCUMENTS

JP  2007-234582 A  9/2007
JP  2011-040304 A  2/2011
(Continued)

*Primary Examiner* — Vanessa Girardi
(74) *Attorney, Agent, or Firm* — Wolf, Greenfield & Sacks, P.C.

(57) ABSTRACT

[Object] To be capable of promptly performing a switching operation of a switch.
[Solving Means] In a switching apparatus according to an embodiment of the present technology, a movable electrode includes a first movable electrode piece, a second movable electrode piece, and a movable contact point. A first fixed electrode includes first and second fixed electrode pieces, the first and second fixed electrode pieces facing each other with the first movable electrode piece disposed between the first and second fixed electrode pieces, the first fixed electrode piece facing the first movable electrode piece with a gap narrower than a gap between the second fixed electrode piece and the first movable electrode piece. A second fixed electrode includes third and fourth fixed electrode pieces, the third and fourth fixed electrode pieces facing each other with the second movable electrode piece disposed between the third and fourth fixed electrode pieces, the third fixed electrode piece facing the second movable electrode piece with a gap narrower than a gap between the fourth fixed electrode piece and the second movable electrode piece. A first fixed contact point is in contact with the movable contact point, the movable contact point moving in a first direction by an electrostatic attractive force between the movable electrode and the first fixed electrode. A second fixed contact point is in contact with the movable contact
(Continued)

point, the movable contact point moving in a second direction opposite to the first direction by an electrostatic attractive force between the movable electrode and the second fixed electrode.

15 Claims, 8 Drawing Sheets

(52) U.S. Cl.
CPC .................. *B81B 2203/051* (2013.01); *H01H 2001/0042* (2013.01); *H01H 2001/0063* (2013.01); *H01H 2001/0078* (2013.01)

(58) Field of Classification Search
USPC ........................................................ 200/181
See application file for complete search history.

(56) References Cited

U.S. PATENT DOCUMENTS 9,640,357 B2 * 5/2017 Hashimoto .......... H01H 85/463
2014/0202838 A1    7/2014 Sano et al.

FOREIGN PATENT DOCUMENTS

WO    WO 2005/117051 A1    12/2005
WO    WO 2013/024658 A1    2/2013

* cited by examiner

RAPID MICRO ELECTRO MECHANICAL SYSTEM SWITCHING APPARATUS

TECHNICAL FIELD

The present technology relates to an electrostatic driving switching apparatus and an electronic apparatus that includes this switching apparatus.

BACKGROUND ART

The MEMS (Micro Electro Mechanical System) switch is a mechanical switch that switches ON/OFF by physical contact, and the main characteristics of the MEMS switch are having isolation properties, linearity, and pressure resistance, which are higher than those of a semiconductor switch.

The electrostatic driving MEMS switch gives a potential difference between a movable electrode and a fixed electrode, drives an actuator by an electrostatic attractive force, and causes the switch to be in an ON-state by causing contact points to be in contact with each other. In order to turn off the switch, typically, the potential difference between electrodes is made zero and the contact points are separated by returning the electrodes to the respective original positions with a restoring force of a return spring.

The switching time, which is the main characteristic of the switching-type switch, is determined by an operation time in which the switch is changed from an OFF-state to an ON-state and a return time in which the switch is changed from an ON-state to an OFF-state. The operation time of the switch is changed by a potential difference, the facing area of the electrode, a spring constant of the return spring, and the distance of movement of the contact points, which are in contact with each other by the movement. In order to shorten the operation time, it only needs to soften the spring, and increase the potential difference and the electrode area. On the other hand, the return time of the switch is changed by a spring constant of the return spring and adhesion of the contact points. In order to shorten the return time, it only needs to harden the spring or weaken the adhesion.

However, because the adhesion of the contact points is decided by the shape of the contact points, the material of the contact points, and the surface state, it is difficult to arbitrarily control the adhesion. Further, because the spring constant and the driving voltage of the switch have a trade-off relationship, the driving voltage is increased when the spring is hardened to reduce the return time. When the return time is long, the switching time is prolonged, and the performance of the switching switch is reduced.

As one way of overcoming such a problem, a method of separately placing an electrode for return to increase a return force has been known. For example, in Patent Literature 1, an electromechanical switch in which a signal transmission electrode fixed to a beam is in contact with a pair of lower signal transmission electrodes on the substrate when the beam is drawn toward a substrate direction with an electrostatic force is described. The electromechanical switch further includes fixed pectinate electrodes placed around the beam, and is configured to return the beam to the original position by generating an electrostatic force between the fixed pectinate electrodes and the beam.

CITATION LIST

Patent Literature

Patent Literature 1: Japanese Patent Application Laid-open No. 2007-234582

DISCLOSURE OF INVENTION

Technical Problem

For example, a switch used in a MIMO (Multi Input Multi Output) circuit needs to have a single-pole single-throw function of moving down through only arbitrary contact points in a plurality of contact points to connect the input signal to an appropriate circuit corresponding to the kind of the input signal. Also in this case, because rapid switching from one contact point to another contact point is desired, it is necessary to shorten the operation time or return time of the switch.

In view of the circumstances as described above, it is an object of the present technology to provide a switching apparatus that is capable of promptly performing a switching operation of a switch and an electronic apparatus that includes this switching apparatus.

Solution to Problem

A switching apparatus according to an embodiment of the present technology includes a movable electrode, a first fixed electrode, a second fixed electrode, a first fixed contact point, a second fixed contact, and an elastic support portion.

The movable electrode includes a first movable electrode piece, a second movable electrode piece, and a movable contact point.

The first fixed electrode includes first and second fixed electrode pieces, the first and second fixed electrode pieces facing each other with the first movable electrode piece disposed between the first and second fixed electrode pieces. The first fixed electrode piece faces the first movable electrode piece with a gap narrower than a gap between the second fixed electrode piece and the first movable electrode piece.

The second fixed electrode includes third and fourth fixed electrode pieces, the third and fourth fixed electrode pieces facing each other with the second movable electrode piece disposed between the third and fourth fixed electrode pieces. The third fixed electrode piece faces the second movable electrode piece with a gap narrower than a gap between the fourth fixed electrode piece and the second movable electrode piece.

The first fixed contact point is configured to be capable of being in contact with the movable contact point, the movable contact point moving in a first direction by an electrostatic attractive force between the movable electrode and the first fixed electrode.

The second fixed contact point is configured to be capable of being in contact with the movable contact point, the movable contact point moving in a second direction opposite to the first direction by an electrostatic attractive force between the movable electrode and the second fixed electrode.

The elastic support portion elastically supports the movable electrode, the movable electrode being capable of moving in the first and second directions.

In the switching apparatus, the first movable electrode piece is disproportionately placed on the side of the first fixed electrode piece. Therefore, when a potential difference is given between the first fixed electrode and the movable electrode, it is possible to cause the movable contact point to promptly move toward the first fixed contact point by an electrostatic attractive force generated between the first movable electrode piece and the first fixed electrode. Further, when the contact points are switched, a potential difference is given between the second fixed electrode and the movable electrode instead of the first fixed electrode. At this time, it is possible to cause the movable contact point to move toward the second fixed contact point by an electrostatic attractive force generated between the second movable electrode piece and the third fixed electrode in addition to the elastic return force of the movable electrode by the elastic support portion. Accordingly, it is possible to promptly perform a switching operation of a switch.

Typically, the second movable electrode piece faces the third fixed electrode piece with a first distance, and faces the fourth fixed electrode piece with a second distance larger than the first distance in a first state in which the movable contact point is in contact with the first fixed contact point.

Similarly, the first movable electrode piece faces the first fixed electrode piece with the first distance, and faces the second fixed electrode piece with the second distance in a second state in which the movable contact point is in contact with the second fixed contact point.

The second distance may be not more than twice the first distance. Accordingly, it is possible to suppress the increase in size of a device while ensuring a prompt switching operation of a switch.

The switching apparatus may further include a driving circuit. The driving circuit is configured to selectively perform a first driving mode and a second driving mode. Operation voltage is applied between the movable electrode and the first fixed electrode to switch a state of the movable contact point to the first state in the first driving mode, the operation voltage being not more than 1.4 times pull-in voltage between the movable electrode and the first fixed electrode. Operation voltage is applied between the movable electrode and the second fixed electrode to switch the state of the movable contact point to the second state in the second driving mode, the operation voltage being not more than 1.4 times pull-in voltage between the movable electrode and the second fixed electrode.

Accordingly, it is possible to reduce the operation voltage that is necessary for switching while ensuring a prompt switching operation of a switch.

The movable electrode may further include a coupling rod that commonly supports the first and second movable electrode pieces and the movable contact point, the coupling rod extending in parallel with the first and second directions.

In this case, the movable contact point may be placed between the first movable electrode piece and the second movable electrode piece, and the elastic support portion may be provided to both ends of the coupling rod.

Alternatively, the movable contact point may be provided to both ends of the coupling rod, and the elastic support portion may be placed between the first movable electrode piece and the second movable electrode piece.

A switching apparatus according to another embodiment of the present technology includes a plurality of switching mechanisms, each of the plurality of switching mechanisms including a movable electrode, a first fixed electrode, a second fixed electrode, a first fixed contact point, a second fixed contact, and an elastic support portion.

The movable electrode includes a first movable electrode piece, a second movable electrode piece, and a movable contact point.

The first fixed electrode includes first and second fixed electrode pieces, the first and second fixed electrode pieces facing each other with the first movable electrode piece disposed between the first and second fixed electrode pieces. The first fixed electrode piece faces the first movable electrode piece with a gap narrower than a gap between the second fixed electrode piece and the first movable electrode piece.

The second fixed electrode includes third and fourth fixed electrode pieces, the third and fourth fixed electrode pieces facing each other with the second movable electrode piece disposed between the third and fourth fixed electrode pieces. The third fixed electrode piece faces the second movable electrode piece with a gap narrower than a gap between the fourth fixed electrode piece and the second movable electrode piece.

The first fixed contact point is configured to be capable of being in contact with the movable contact point, the movable contact point moving in a first direction by an electrostatic attractive force between the movable electrode and the first fixed electrode.

The second fixed contact point is configured to be capable of being in contact with the movable contact point, the movable contact point moving in a second direction opposite to the first direction by an electrostatic attractive force between the movable electrode and the second fixed electrode.

The elastic support portion elastically supports the movable electrode, the movable electrode being capable of moving in the first and second directions.

Accordingly, for example, it is possible to easily achieve an SPOT switching apparatus.

An electronic apparatus according to an embodiment of the present technology includes: a switching apparatus including a movable electrode, a first fixed electrode, a second fixed electrode, a first fixed contact point, a second fixed contact, and an elastic support portion.

The movable electrode includes a first movable electrode piece, a second movable electrode piece, and a movable contact point.

The first fixed electrode includes first and second fixed electrode pieces, the first and second fixed electrode pieces facing each other with the first movable electrode piece disposed between the first and second fixed electrode pieces. The first fixed electrode piece faces the first movable electrode piece with a gap narrower than a gap between the second fixed electrode piece and the first movable electrode piece.

The second fixed electrode includes third and fourth fixed electrode pieces, the third and fourth fixed electrode pieces facing each other with the second movable electrode piece disposed between the third and fourth fixed electrode pieces. The third fixed electrode piece faces the second movable electrode piece with a gap narrower than a gap between the fourth fixed electrode piece and the second movable electrode piece.

The first fixed contact point is configured to be capable of being in contact with the movable contact point, the movable contact point moving in a first direction by an electrostatic attractive force between the movable electrode and the first fixed electrode.

The second fixed contact point is configured to be capable of being in contact with the movable contact point, the movable contact point moving in a second direction opposite to the first direction by an electrostatic attractive force between the movable electrode and the second fixed electrode.

The elastic support portion elastically supports the movable electrode, the movable electrode being capable of moving in the first and second directions.

Advantageous Effects of Invention

As described above, according to the present technology, it is possible to promptly perform a switching operation of a switch.

It should be noted that the effect described here is not necessarily limitative and may be any effect described in the present disclosure.

MODE(S) FOR CARRYING OUT THE INVENTION

Hereinafter, embodiments of the present technology will be described with reference to the drawings.

<First Embodiment>

Figure 1:
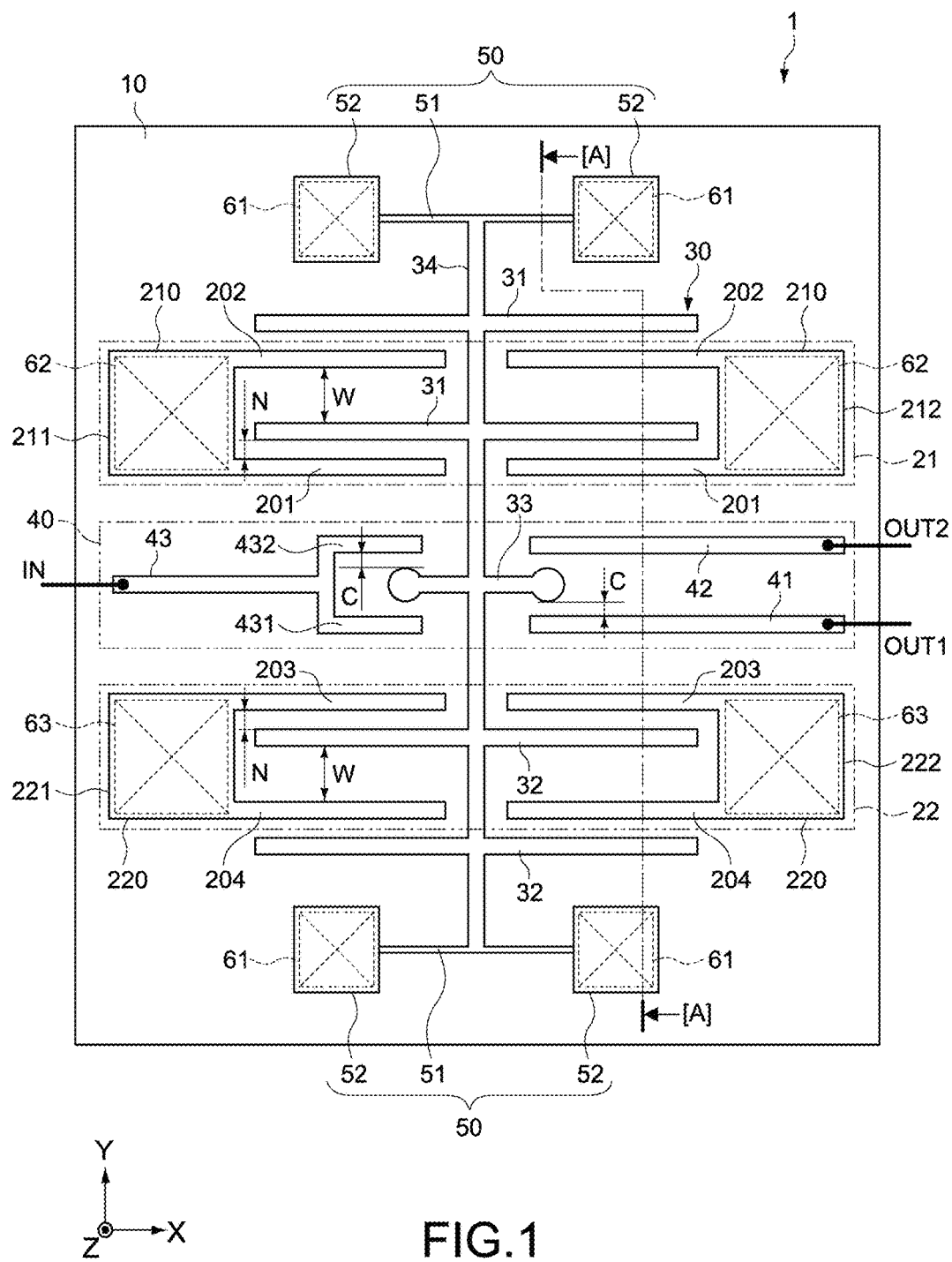
FIG. 1 A schematic plan view showing the configuration of a switching apparatus according to a first embodiment of the present technology.
Figure 2:
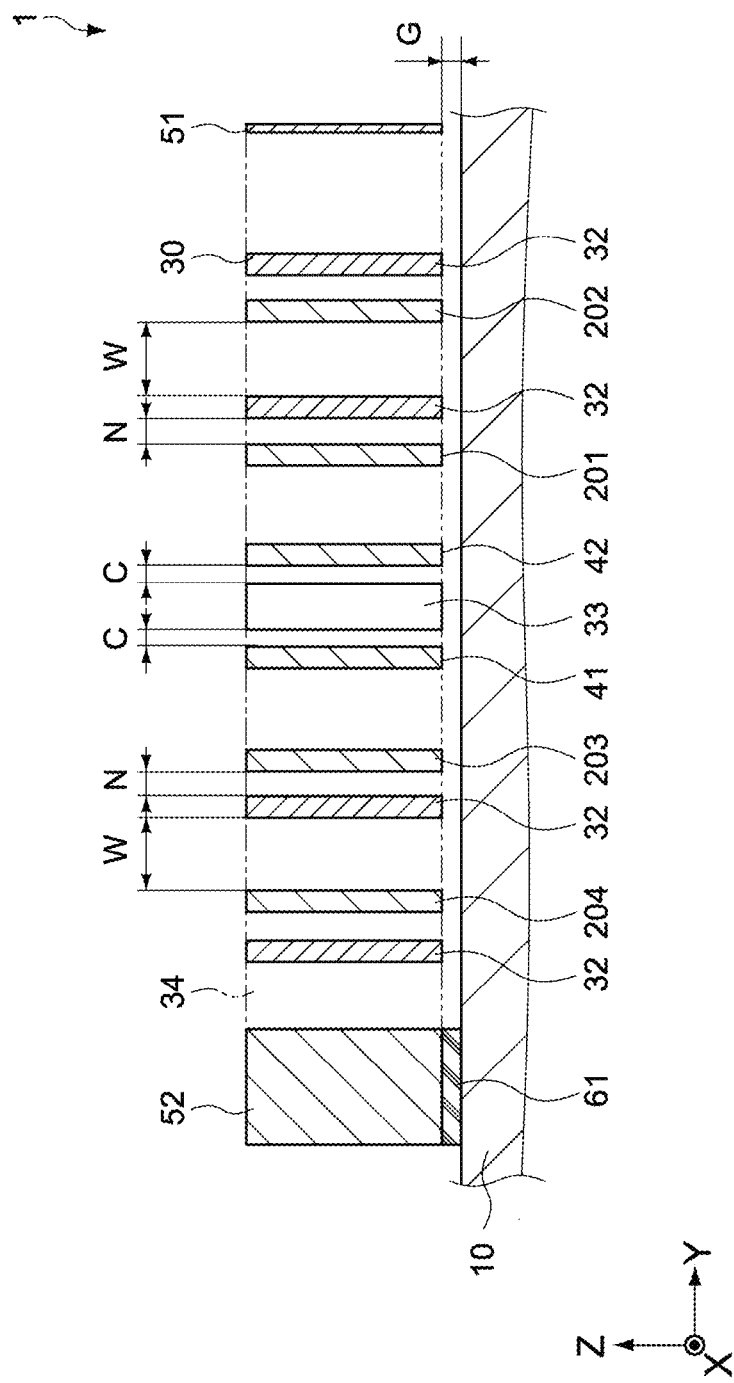
FIG. 2 A cross-sectional view taken along the line [A]-[A] in FIG. 1.

FIG. 1 is a schematic plan view showing the configuration of a switching apparatus according to a first embodiment. FIG. 2 is a cross-sectional view taken along the line [A]-[A] in FIG. 1. In each figure, an X axis and Y axis represent plane directions perpendicular to each other, and a Z axis represents a height (thickness) direction perpendicular thereto. The same shall apply to the subsequent figures.

[Whole Configuration of Switching Apparatus]

A switching apparatus 1 according to this embodiment is configured as a bulk MEMS type electrostatic driving push/pull switch. The switching apparatus 1 is typically prepared by performing fine processing on the surface of a SOI (Silicon On Insulator) substrate. The SOI substrate includes a laminated body of a supporting layer formed of silicon, a BOX (Buried Oxide) layer that is formed on the supporting layer and formed of silicon oxide ($SiO_2$), and an active layer that is bonded to the BOX layer and formed of silicon.

The switching apparatus 1 includes a substrate 10, a first fixed electrode 21, a second fixed electrode 22, a movable electrode 30, a contact point structure 40, and elastic support portions 50. These respective units constitute an actuator unit in the switching apparatus 1.

The substrate 10 is formed of a plate member that has conductivity and a substantially rectangular shape. In this embodiment, the substrate 10 is formed of a silicon substrate. The substrate 10 is formed by processing the supporting layer in the SOI substrate in a predetermined shape, and configured as a supporting substrate that supports the actuator unit. The thickness of the substrate 10 is not particularly limited, and is several ten μm to several hundred μm, for example. The substrate 10 is typically connected to a GND (ground) potential.

The above-mentioned actuator unit (the first fixed electrode 21, the second fixed electrode 22, the movable electrode 30, the contact point structure 40, and the elastic support portions 50) is formed of a conductive silicon substrate, and formed by performing fine processing on a common silicon substrate, for example. Specifically, the above-mentioned actuator unit is formed of an active layer in a SOI substrate, and has a specific resistance of several Ω cm to several MΩ cm and a thickness of several μm to 100 μm, for example. Note that the surface and lateral surface of the respective units constituting the above-mentioned actuator unit may be covered with an insulating film such as a silicon oxide film.

(Movable Electrode)

The movable electrode 30 includes a first movable electrode piece 31, a second movable electrode piece 32, and a movable contact point 33.

The first movable electrode piece 31, the second movable electrode piece 32, and the movable contact point 33 are each formed in a substantially rectangular plate shape with an X-axis direction as a long side direction. Their width dimension along a Y-axis direction is set to be lower than their height dimension along a Z-axis direction as shown in FIG. 2. The first and second movable electrode pieces 31 and 32 each have a pectinate shape, and are arranged so as to face each other in the Y-axis direction. The movable contact point 33 is placed between the first movable electrode piece 31 and the second movable electrode piece 32. The long side of the movable contact point 33 along the X-axis direction is shorter than the first and second movable electrode pieces 31 and 32. However, it goes without saying that it is not limited thereto.

The movable electrode 30 further includes a coupling rod 34 that commonly supports the first and second movable electrode pieces 31 and 32 and the movable contact point 33. The coupling rod 34 is formed in a substantially rectangular plate shape that extends in parallel with the Y-axis direction, and coupled to the central portions of the first and second movable electrode pieces 31 and 32 and the central portion of the movable contact point 33. Specifically, the coupling rod 34 functions as a push rod that drives the first and second movable electrode pieces 31 and 32 along the Y-axis direction in synchronization with each other. The width dimension of the coupling rod 34 along the X-axis direction is equivalent to the above-mentioned width dimension of the first and second movable electrode pieces 31 and 32.

The movable electrode 30 is supported by a pair of elastic support portions 50 so that the movable electrode 30 faces the surface of the substrate 10 with a predetermined gap G (see FIG. 2) placed therebetween. The pair of elastic support portions 50 is provided to both ends of the movable electrode 30 in the Y-axis direction, i.e., both ends of the coupling rod 34. The elastic support portions 50 each include an elastic plate portion 51 formed in a substantially rectangular plate shape with the X-axis direction as a long side direction and a pair of anchor portions 52 that support both ends of the elastic plate portion 51.

The coupling rod 34 is coupled to the central portion of the elastic plate portion 51. The elastic plate portion 51 has a thickness substantially similar to that of the movable electrode 30, and is configured to be able to be elastically deformed along with the movement of the movable electrode 30 along the Y-axis direction (see part A and part B of FIG. 3). Typically, the width dimension of the elastic plate portion 51 along the Y-axis direction is smaller than the width dimension of the first and second movable electrode pieces 31 and 32.

The anchor portion 52 is fixed to the surface of the substrate 10 via a bonding portion 61 as shown in FIG. 2. The movable electrode 30 and the elastic plate portion 51 face the surface of the substrate 10 via space (gap G) by extending between the plurality of anchor portions 52. Therefore, the movable electrode 30 and the elastic plate portion 51 are supported by the anchor portions 52 in non-contact with the substrate 10. The bonding portion 61 is formed by performing pattern etching on the BOX layer in the SOI substrate in a predetermined shape.

The gap G formed between the substrate 10 and the movable electrode 30 corresponds to the thickness of the bonding portion 61, i.e., the BOX layer. The movable electrode 30 is prepared by performing shape processing on the first and second movable electrode pieces 31 and 32, the movable contact point 33, the coupling rod 34, and the elastic plate portion 51 before removing the BOX layer that is the base thereof. The method of processing the movable electrode 30 is not particularly limited. Typically, it is formed with an anisotropic dry etching method such as a reactive ion etching (RIE) method. Also the method of processing the BOX layer is not particularly limited. For example, an isotropic etching process that is capable of selectively removing the BOX layer can be applied. The etching method is not particularly limited, and a wet etching method and a dry etching method can be applied.

(First and Second Fixed Electrodes)

The first fixed electrode 21 includes a pair of electrode units 211 and 212 placed so as to face each other in the X-axis direction with the movable electrode 30 disposed therebetween. Each unit of the pair of electrode units 211 and 212 includes first and second fixed electrode pieces 201 and 202 placed so as to sandwich one first movable electrode piece 31 and face each other in the Y-axis direction, and an anchor unit 210 that supports one ends of the first and second fixed electrode pieces 201 and 202. The anchor unit 210 is fixed to the surface of the substrate 10 via a bonding portion 62 that is a part of the above-mentioned BOX layer. Therefore, the first and second fixed electrode pieces 201 and 202 are supported by the anchor unit 210 in non-contact with the substrate 10, and face the surface of the substrate 10 via space (gap G).

Similarly, the second fixed electrode 22 includes a pair of electrode units 221 and 222 placed so as to face each other in the X-axis direction with the movable electrode 30 disposed therebetween. Each unit of the pair of electrode units 221 and 222 includes third and fourth fixed electrode pieces 203 and 204 placed so as to sandwich one second movable electrode piece 32 and face each other in the Y-axis direction, and an anchor unit 220 that supports one ends of the third and fourth fixed electrode pieces 203 and 204. The anchor unit 220 is fixed to the surface of the substrate 10 via a bonding portion 63 that is a part of the above-mentioned BOX layer. Therefore, the third and fourth fixed electrode pieces 203 and 204 are supported by the anchor unit 220 in non-contact with the substrate 10, and face the surface of the substrate 10 via space (gap G).

The first to fourth fixed electrode pieces 201 to 204 are placed in parallel with the first and second movable electrode pieces 31 and 32, and the width dimension of the first to fourth fixed electrode pieces 201 to 204 along the Y-axis direction is substantially the same as the width dimension of the first and second movable electrode pieces 31 and 32.

In the first fixed electrode 21, the first fixed electrode piece 201 located on the side of the movable contact point 33 faces the first movable electrode piece 31 in the Y-axis direction via a gap (N), and the second fixed electrode piece 202 faces the first movable electrode piece 31 in the Y-axis direction via a gap (W). Similarly, in the second fixed electrode 22, the third fixed electrode piece 203 located on the side of the movable contact point 33 faces the second movable electrode piece 32 in the Y-axis direction via the gap (N), and the fourth fixed electrode piece 204 faces the second movable electrode piece 32 in the Y-axis direction via the gap (W).

The gap (N) is set to be a value smaller than the gap (W). Therefore, the first fixed electrode piece 201 faces the first movable electrode piece 31 with a gap narrower than the gap between the second fixed electrode piece 202 and the first movable electrode piece 31. On the other hand, the third fixed electrode piece 203 faces the second movable electrode piece 32 with a gap narrower than the gap between the fourth fixed electrode piece 204 and the second movable electrode piece 32.

(Contact Point Structure)

The contact point structure 40 is provided between the first fixed electrode 21 and the second fixed electrode 22, and includes a first fixed contact point 41, a second fixed contact point 42, and a common contact point 43. The first and second fixed contact points 41 and 42 and the common contact point 43 are placed so as to face each other in the X-axis direction with the movable electrode 30 disposed therebetween.

The first and second fixed contact points 41 and 42 are placed so as to sandwich one end of the movable contact point 33 and face each other in the Y-axis direction. The first fixed contact point 41 is located on the side of the second fixed electrode 22 of the movable contact point 33, and is configured to be able to be in contact with the movable contact point 33 that moves in a first direction (downward direction in FIG. 1 (−Y direction)) by an electrostatic attractive force between the first movable electrode piece 31 and the first fixed electrode piece 201. The second fixed contact point 42 is located on the side of the first fixed electrode 21 of the movable contact point 33, and is configured to be able to be in contact with the movable contact point 33 that moves in a second direction (upward direction in FIG. 1 (+Y direction)) by an electrostatic attractive force between the second movable electrode piece 32 and the third fixed electrode piece 203.

The first and second fixed contact points 41 and 42 are placed in parallel with the first to fourth fixed electrode piece 201 to 204, and the width dimension of the first and second fixed contact points 41 and 42 along the Y-axis direction is substantially the same as the width dimension of the first to fourth fixed electrode piece 201 to 204.

The common contact point 43 includes first and second branch portions 431 and 432 that respectively face the first and second fixed contact points 41 and 42 in the X-axis direction. The first and second branch portions 431 and 432 are placed so as to sandwich another end of the movable contact point 33 and face each other along the Y-axis direction, and are respectively placed on the same axes as those of the first and second fixed contact points 41 and 42.

The first fixed contact point 41 and the common contact point 43 (first branch portion 431) face the movable contact point 33 in the Y-axis direction via a gap (C), and are simultaneously in contact with the movable contact point 33 that moves in the first direction (−Y direction). Similarly, the second fixed contact point 42 and the common contact point 43 (second branch portion 432) face the movable contact point 33 in the Y-axis direction via the gap (C), and are simultaneously in contact with the movable contact point 33 that moves in the second direction (+Y direction). The gap C is set to be smaller than the above-mentioned gap N.

Each size of the gaps G, N, and C is not particularly limited, and may be appropriately set depending on the size, specification, and the like of the switching apparatus. In this embodiment, each size of the gaps G, N, and C is set to satisfy the condition of the following formula (1).

$$(W-C)/(N+C)>1 \tag{1}$$

The contact point structure 40 forms a SPDT (Single Pole Double Throw) contact point. Specifically, a signal input line, a first signal output line, and a second signal output line are respectively electrically connected to the common contact point 43, the first fixed contact point 41, and the second fixed contact point 42. The signal transmitted through the contact point structure 40 is not particularly limited, and may be an electric signal such as a high-frequency signal (RF), a direct current signal, an alternate current signal, and a pulse signal, or a superimposed signal thereof.

Although the contact point structure 40 is fixed on the substrate 10, the fixed structure is not particularly limited. Similarly to the first and second fixed electrodes 21 and 22, the contact point structure 40 may be fixed via a bonding portion (whose illustration is omitted) formed by a part of the BOX layer.

[Operation of Switching Apparatus]

Next, a typical operation of the switching apparatus 1 according to this embodiment configured as described above will be described. Part A and part B of FIG. 3 are each a schematic diagram showing an example of the operation of the switching apparatus 1.

Figure 3:
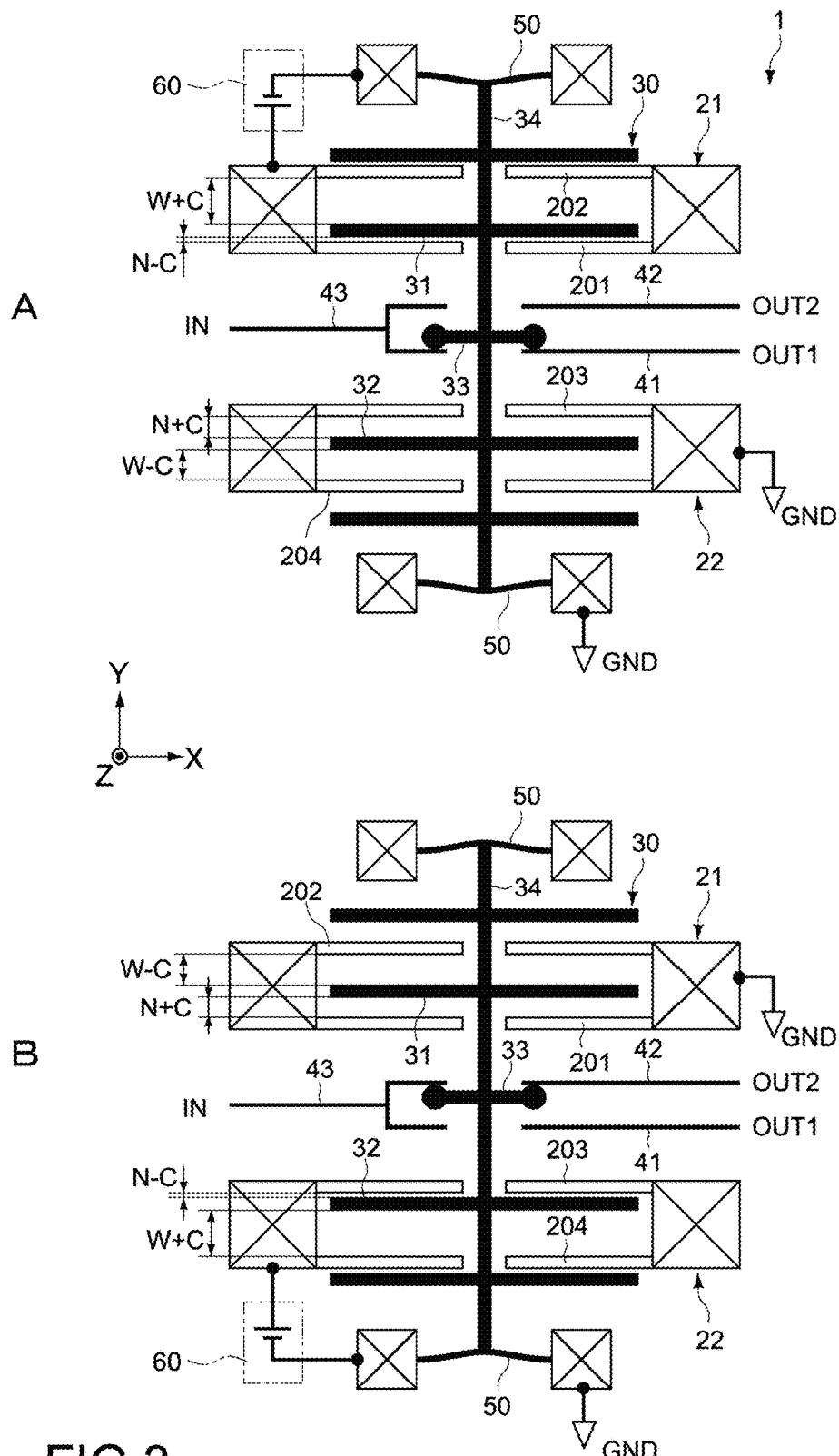
FIG. 3 A schematic diagram showing an example of the operation of the switching apparatus.

The state of the switching apparatus 1 is switched between a first state in which the movable contact point 33 is in contact with the first fixed contact point 41 and the common contact point 43 as shown in part A of FIG. 3, and a second state in which the movable contact point is in contact with the second fixed contact point 42 and the common contact point 43 as shown in part B of FIG. 3. In this structure, the movable electrode 30 and the first fixed electrode 21 constitute one actuator (first actuator), and the movable electrode 30 and the second fixed electrode 22 constitute another one actuator (second actuator).

The switching apparatus 1 is connected to a driving circuit 60 that switches the first state and the second state. Note that the driving circuit 60 may be configured as a part of the switching apparatus 1.

The driving circuit 60 selectively performs a first driving mode and a second driving mode.

In the first driving mode, as shown in part A of FIG. 3, the state of the movable contact point 33 is switched to the above-mentioned first state by applying operation voltage between the movable electrode 30 and the first fixed electrode 21 (electrode units 211 and 212) to generate an electrostatic attractive force due to the potential difference between both electrodes. Accordingly, an input port (IN) and a first output port (OUT1) are electrically connected to each other.

On the other hand, in the second driving mode, as shown in part B of FIG. 3, the state of the movable contact point 33 is switched to the above-mentioned second state by applying operation voltage between the movable electrode 30 and the second fixed electrode 22 (electrode units 221 and 222) to generate an electrostatic attractive force due to the potential difference between both electrodes. Accordingly, the input port (IN) and a second output port (OUT2) are electrically connected to each other.

In the above-mentioned first state, the potential difference between the movable electrode 30 and the second fixed electrode 22 is kept at zero. In this case, for example, potential of the same polarity (e.g., GND potential) is applied to the movable electrode 30 and the second fixed electrode 22 (part A of FIG. 3). Similarly, in the above-mentioned second state, the potential difference between the movable electrode 30 and the first fixed electrode 21 is kept at zero. Also in this case, for example, potential of the same polarity (e.g., GND potential) is applied to the movable electrode 30 and the first fixed electrode 21 (part B of FIG. 3)

Note that instead of the above, positive potential may be applied to the movable electrode 30 and the second fixed electrode 22 in the first state, and positive potential may be applied to the movable electrode 30 and the first fixed electrode 21 in the second state.

In the switching apparatus according to this embodiment, regarding the first fixed electrode 21, the first fixed electrode piece 201 faces the first movable electrode piece 31 with the gap (N) narrower than that gap between the second fixed electrode piece 202 and the first movable electrode piece 31. Accordingly, because the first fixed electrode piece 201 is capable of causing an electrostatic attractive force to act, which is stronger than that caused to act by the second fixed electrode piece 202, when the state of the switching apparatus 1 is caused to transfer from a voltage non-application state to the first state, it is possible to properly cause the movable contact point 33 to move toward the first fixed contact point 41.

Similarly, regarding the second fixed electrode 22, the third fixed electrode piece 203 faces the second movable electrode piece 32 with the gap (N) narrower than the gap between the fourth fixed electrode piece 204 and the second movable electrode piece 32. Accordingly, when the state of the switching apparatus 1 is caused to transfer from a voltage non-application state to the second state, it is possible to properly cause the movable contact point 33 to move toward the second fixed contact point 42.

Further, when the switching apparatus 1 is in the first state, as shown in part A of FIG. 3, the second movable electrode piece 32 faces the third fixed electrode piece 203 with a first distance (N+C), and faces the fourth fixed electrode piece 204 with a second distance (W−C). Similarly, when the switching apparatus 1 is in the second state, as shown in part B of FIG. 3, the first movable electrode piece 31 faces the first fixed electrode piece 201 with the first distance (N+C), and faces the second fixed electrode piece 202 with the second distance (W−C). Accordingly, as shown below, it is possible to shorten the operation time of the switching apparatus 1.

(Consideration on Operation Time)

For example, a switch used in a MIMO (Multi Input Multi Output) circuit needs to have a single-pole single-throw function of moving down through only arbitrary contact points in a plurality of contact points to connect the input signal to an appropriate circuit corresponding to the kind of the input signal. In this case, because rapid switching from one contact point to another contact point is desired, it is necessary to shorten the operation time of the switch or the return time.

Hereinafter, the operation of the switching apparatus 1 when the state of the switching apparatus 1 is switched from the first state (part A of FIG. 3) to the second state (part B of FIG. 3) will be considered.

An electrostatic attractive force (F) at the moment when the potential difference between the movable electrode 30 and the first fixed electrode 21 is zero and a potential difference, i.e., operation voltage (V) is applied between the movable electrode 30 and the second fixed electrode 22 can be represented by the following formula (2) with a force toward the operation direction as positive.

$$F = F1 - F2 \qquad (2)$$
$$= \{\varepsilon_0 S/(N+C)^2\}V^2/2 - \{\varepsilon_0 S/(W-C)^2\}V^2/2$$

In the formula, the F1 represents an electrostatic attractive force generated between the second movable electrode piece 32 and the third fixed electrode piece 203, F2 represents an electrostatic attractive force generated between the second movable electrode piece 32 and the fourth fixed electrode piece 204, $\varepsilon_0$ represents a dielectric constant, and S represents the facing area between the second movable electrode piece 32 and the third and fourth fixed electrode pieces 203 and 204.

In the formula (2), when F is larger than 0, the return force from the first state to the second state is increased because the above-mentioned electrostatic attractive force (F) acts, in addition to the return force of a spring (kC; k is a spring constant of the elastic support portions 50, and C represents displacement of the movable contact point 33) that originally acts as a restoring force of the switch. Therefore, it can be seen that the condition of (W−C)/(N+C)>1 (formula (1)) only has to be satisfied to make the return time shorter than that in the single-pole single-throw (SPST) structure with only the elastic support portion.

Figure 4:
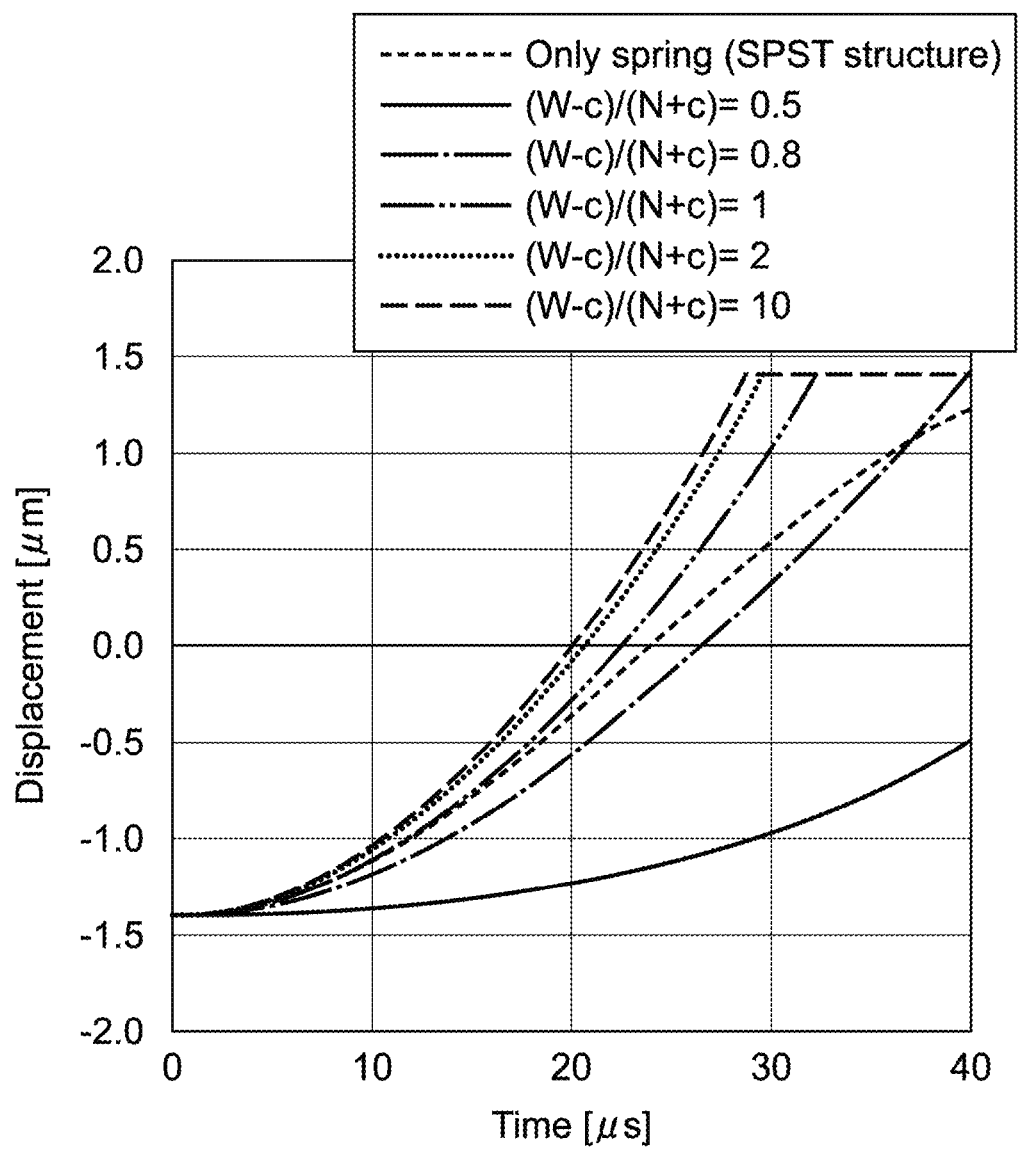
FIG. 4 A diagram showing the results of calculating the return time (operation time) of the switching apparatus, which are compared with the return time in the SPST structure.

FIG. 4 shows the results of calculating the return time (operation time) when the value of (W−C)/(N+C) is changed, which are compared with the return time in the SPST structure. In FIG. 4, the horizontal axis represents the return time, and the vertical axis represents the displacement.

From FIG. 4, it can be seen that the return time is shorter than that in the SPST structure when the formula of (W−C)/(N+C)>1 is satisfied. On the other hand, when the value of (W−C)/(N+C) is increased to two or more, a saturation tendency is exhibited. Accordingly, it can be seen that a formula of (W−C)/(N+C)<2 only has to be satisfied in order not to unnecessarily increase the switch size. Specifically, in this case, the second distance (W−C) is set to be not more than twice the first distance (N+C).

Note that the calculation results shown in FIG. 4 do not take into account the adhesion of the movable contact point 33 and the first fixed contact point 41. Actually, the return force is affected by the adhesion of these contact points. Also in this case, the return force is larger (return time is shorter) than that in the SPST structure.

It is clear that the above consideration can be applied also to the case where the state of the switching apparatus 1 is switched from the second state (part B of FIG. 3) to the first state (part A of FIG. 3) similarly.

As described above, according to the switching apparatus 1 in this embodiment, the return time (operation time) is shortened as compared with the case of the SPST structure because the force (F) of an electrostatic attractive force is added to the return force of the return spring (elastic plate portion 51) in the elastic support portions 50. Further, because it is unnecessary to provide a dedicated electrode to increase the return force, it is possible to shorten the return time without increasing the switch size. Further, because the movable contact point 33 is placed between the first movable electrode piece 31 and the second movable electrode piece 32, it is possible to achieve a further reduction in the size of the switching apparatus 1.

(Consideration on Operation Voltage)

Next, operation voltage (V) of the driving circuit 60, which is necessary for switching the state of the switching apparatus 1, will be considered.

Figure 5:
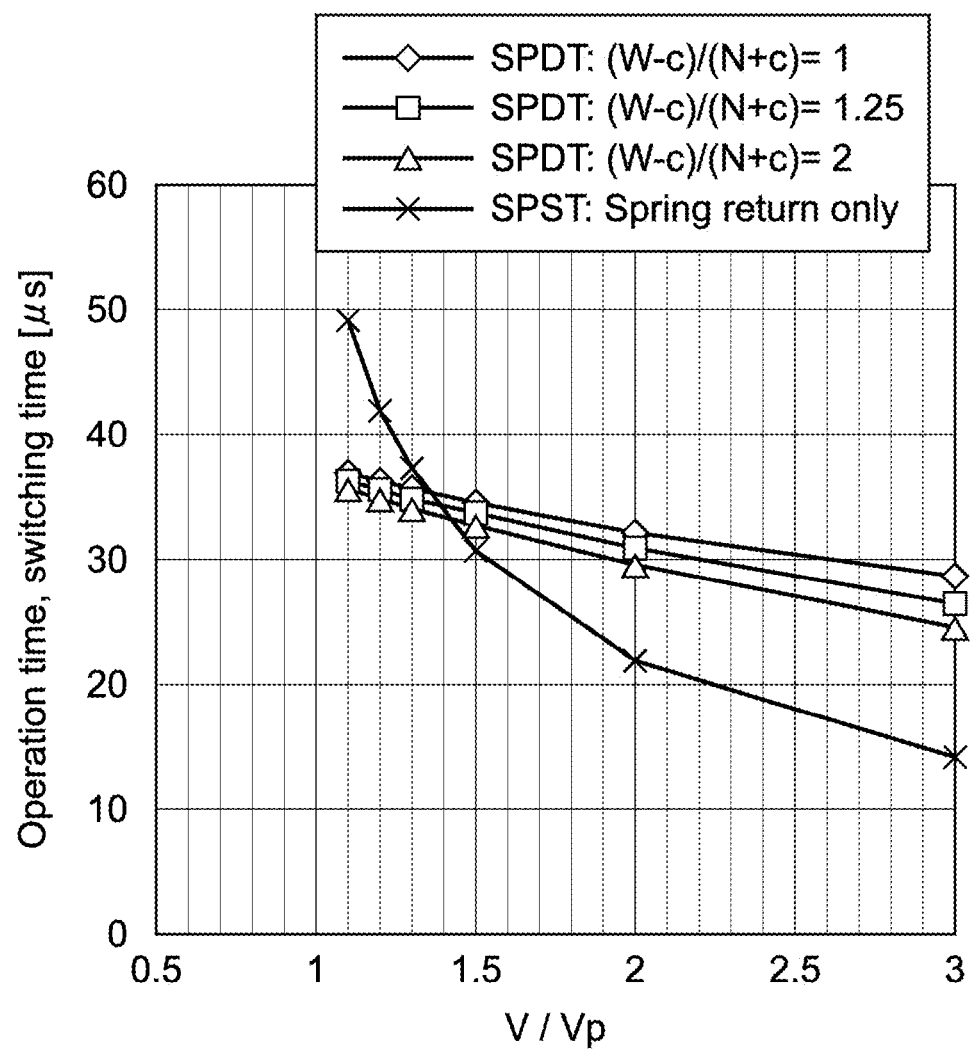
FIG. 5 A diagram showing the results of the driving voltage dependency of the operation time of the switching apparatus, which are compared with the operation time in the SPST structure.

FIG. 5 shows the results of the driving voltage dependency of the operation time when the value of (W−C)/(N+C) is changed, which are compared with the operation time in the SPST structure. In FIG. 5, the horizontal axis represents the voltage ratio between the operation voltage (V) and the pull-in voltage (Vp), and the vertical axis represents the operation time (switching time).

The pull-in voltage (Vp) is voltage where an electrode is pulled in and in contact with a contact point when it exceeds certain voltage in an electrostatic actuator, and represented by the following formula (3).

$$Vp = \{(8kN^3)/(27\varepsilon_0 S)\}^{1/2} \qquad (3)$$

In the formula, k represents a spring constant of the return spring, N represents a gap between electrodes, S represents the facing area between electrodes, and $\varepsilon_0$ represents a dielectric constant. In the switch of the SPST structure, the minimum value of the operation voltage is the pull-in voltage.

As shown in FIG. 5, the operation time of the SPST structure in which it returns only with the return spring is in inverse proportion to V/Vp. On the other hand, it can be seen that the operation time of the switching apparatus (SPDT) according to this embodiment is linearly changed with respect to V/Vp, and is shorter than the operation time of the SPST structure in the area of V/Vp of not more than 1.4. That is, in order to make the operation voltage of the switch not more than 1.4 times, it only has to satisfy the following formula (4).

$$V < 1.4 \times \{(8kN^3)/(27\varepsilon_0 S)\}^{1/2} = 1.4 Vp \qquad (4)$$

Specifically, the driving circuit 60 switches the state of the movable contact point 33 to the first state by applying operation voltage, which is not more than 1.4 times the pull-in voltage between the movable electrode 30 and the first fixed electrode 21, between these electrodes in the first driving mode. On the other hand, the driving circuit 60 switches the state of the movable contact point 33 to the second state by applying operation voltage, which is not more than 1.4 times the pull-in voltage between the movable electrode 30 and the second fixed electrode 22, between these electrodes in the second driving mode.

As described above, according to the switching apparatus 1 in this embodiment, it is possible to reduce the operation voltage while shortening the operation time as compared with the case of the SPST structure.

<Second Embodiment>

Figure 6:
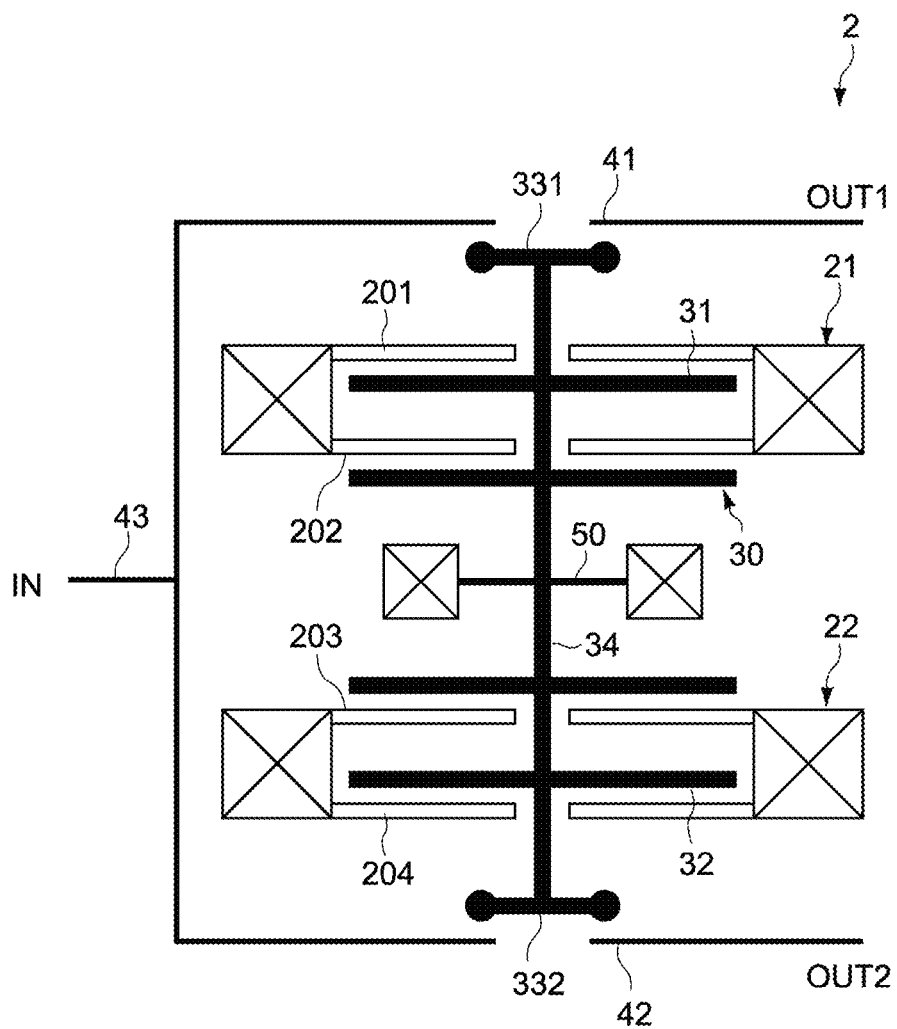
FIG. 6 A schematic plan view showing the configuration of a switching apparatus according to a second embodiment of the present technology.

FIG. 6 is a schematic plan view showing the configuration of a switching apparatus according to a second embodiment of the present technology. Hereinafter, configurations that are different from those according to the first embodiment will be mainly described, the same configurations as those according to the embodiment will be denoted by the same reference symbols, and description thereof will be omitted or simplified.

A switching apparatus 2 according to this embodiment is different from that in the first embodiment in that movable contact points 331 and 332 are respectively provided to both ends of the coupling rod 34 of the movable electrode 30, and the elastic support portions 50 is placed between the first movable electrode piece 31 and the second movable electrode piece 32. Because other configurations of the movable electrode 30 and the configurations of the first and second fixed electrodes 21 and 22 are the same as those in the first embodiment, description thereof will be omitted.

Also in the switching apparatus 2 according to this embodiment, operation and effect similar to those according to the first embodiment can be obtained. According to the switching apparatus 2 in this embodiment, because the first fixed contact point 41 and the second fixed contact point 42 constituting a contact point structure are separately placed on both ends of the switching apparatus 2 in the Y-axis direction, it is possible to divide a wiring into an upper portion and a lower portion as shown in FIG. 6. Accordingly, it is possible to reduce the cross talk between the output ports (OUT1 and OUT2).

<Third Embodiment>

Figure 7:
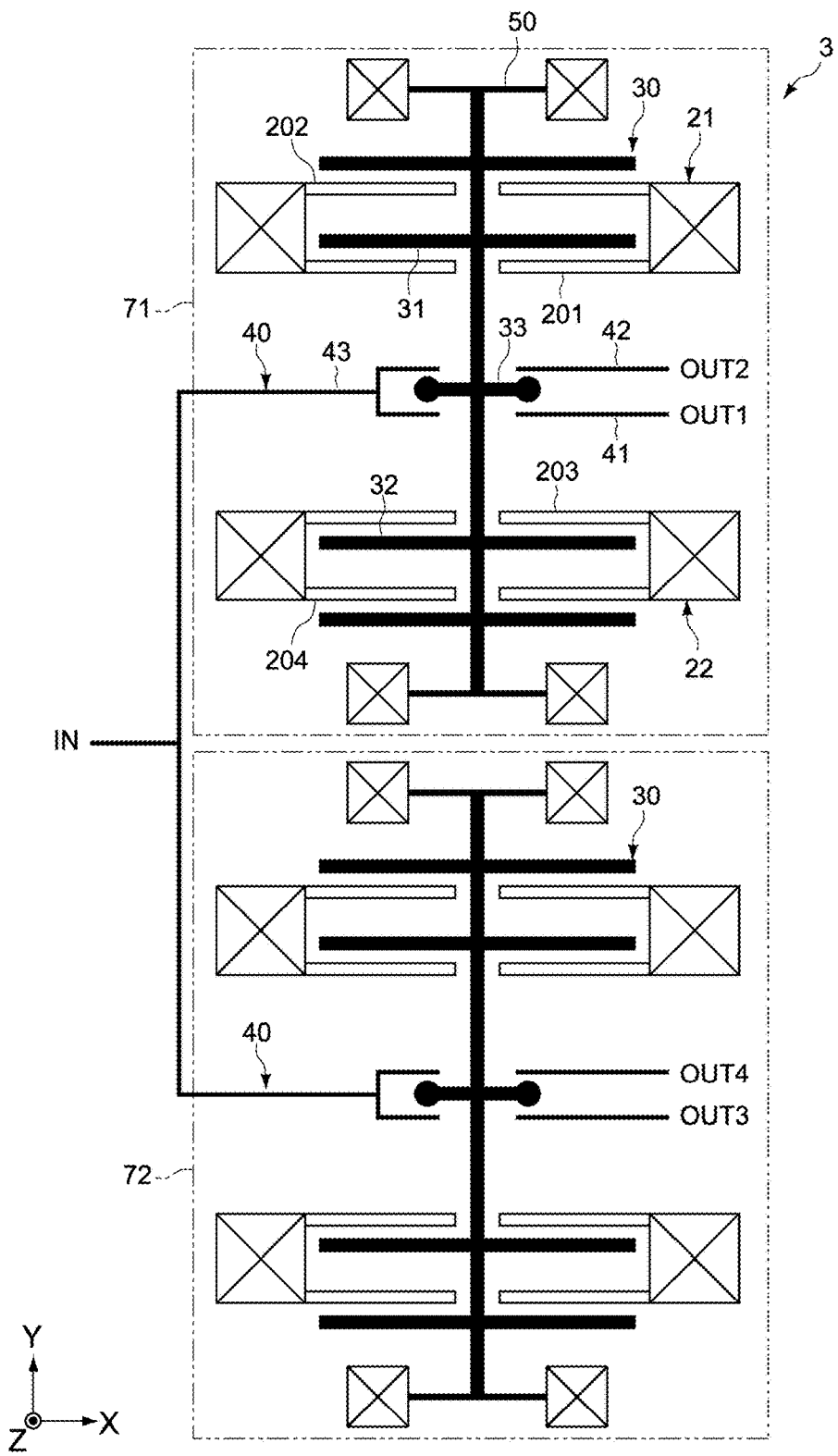
FIG. 7 A schematic plan view showing the configuration of a switching apparatus according to a third embodiment of the present technology.

FIG. 7 is a schematic plan view showing the configuration of a switching apparatus according to a third embodiment of the present technology. Hereinafter, configurations that are different from those according to the first embodiment will be mainly described, the same configurations as those according to the embodiments will be denoted by the same reference symbols, and description thereof will be omitted or simplified.

A switching apparatus 3 according to this embodiment includes a first switching mechanism 71 and a second switching mechanism 72. The first and second switching mechanisms 71 and 72 are placed so as to face each other in the Y-axis direction. The first and second switching mechanisms 71 and 72 each include the same configuration as that of the switching apparatus 1 described in the first embodiment.

Note that the switching mechanisms 71 and 72 are not limited thereto, and may be each configured as the switching apparatus 2 described in the second embodiment. Further, the number of switching mechanisms is not limited to two, and three or more switching mechanisms may be placed.

In the switching apparatus 3 according to this embodiment, the common contact points 43 in the first and second switching mechanisms 71 and 72 are connected to the same signal input line. Accordingly, a MEMS switch of a SPOT structure is configured.

Also in this embodiment, it is possible to obtain operation and effect similar to those according to the first embodiment. According to this embodiment, by placing a plurality of switching mechanisms, it is possible to easily form a switching device of a SPnT structure.

<Fourth Embodiment>

Figure 8:
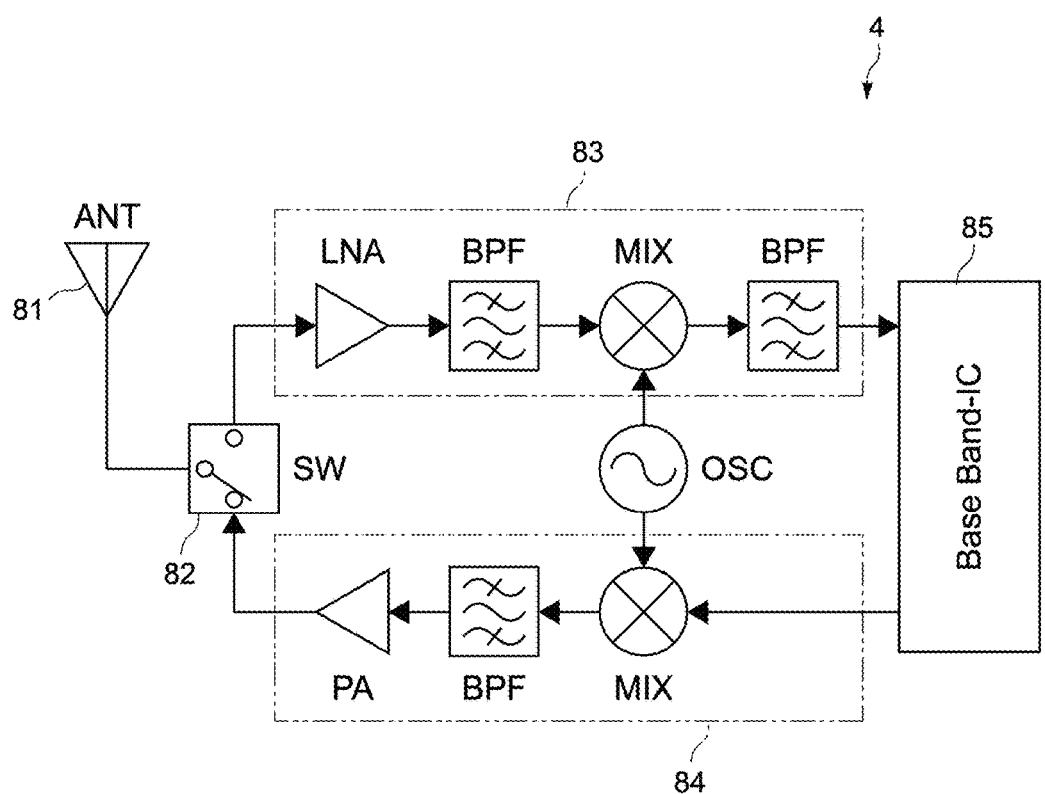
FIG. 8 A schematic block diagram showing the configuration of an electronic apparatus according to a fourth embodiment of the present technology.

FIG. 8 is a block diagram showing the configuration of an electronic apparatus including the switching apparatus according to the first embodiment of the present technology.

In this embodiment, an electronic apparatus 4 constitutes a wireless module such as a portable information terminal. The electronic apparatus 4 includes an antenna 81, a switch 82, a reception circuit 83, a transmission circuit 84, and a processing circuit 85. Although the reception circuit 83 includes a low noise amplifier (LNA), a band-pass filter (BPF), a mixer (MIX), and the like, and the transmission circuit 84 includes a power amplifier (PA), a band-pass filter (BPF), a mixer (MIX), and the like, detailed description thereof will be omitted.

The switch 82 is an element for switching between the antenna 81 and the transmission circuit 83 and between the antenna 81 and the reception circuit 84, and configured as the switching apparatus 1 described in the first embodiment, for example. Specifically, in FIG. 1, the input port (IN), the first output port (OUT1), and the second output port (OUT2) of the contact point structure 40 are respectively connected to the antenna 81, the transmission circuit 84, and the reception circuit 83.

According to this embodiment, because the switching switch (SW) of transmission/reception is configured by the switching apparatus 1 according to an embodiment of the present technology, it is possible to rapidly perform an switching operation of the switch, and achieve small-sized communication equipment that takes advantage of high isolation and has high performance.

Although embodiments of the present technology have been described, the present technology is not limited to the above-mentioned embodiments, and it goes without saying that various modifications can be made.

For example, in the above-mentioned embodiments, electrode layout in which electrode units of the first and second fixed electrodes 21 and 22 are placed on both sides of the movable electrode 30 is employed. However, it is possible to employ an electrode structure in which the first and second fixed electrodes and the movable electrode are independently combined.

Further, in the above-mentioned embodiments, the switching apparatus for communication equipment has been described as an example. However, the present technology is not limited thereto, and can be applied to a switching device used for various control circuits.

It should be noted that the present technology may take the following configurations.

(1) A switching apparatus, including:

a movable electrode that includes a first movable electrode piece, a second movable electrode piece, and a movable contact point;

a first fixed electrode that includes first and second fixed electrode pieces, the first and second fixed electrode pieces facing each other with the first movable electrode piece disposed between the first and second fixed electrode pieces, the first fixed electrode piece facing the first movable electrode piece with a gap narrower than a gap between the second fixed electrode piece and the first movable electrode piece;

a second fixed electrode that includes third and fourth fixed electrode pieces, the third and fourth fixed electrode pieces facing each other with the second movable electrode piece disposed between the third and fourth fixed electrode pieces, the third fixed electrode piece facing the second movable electrode piece with a gap narrower than a gap between the fourth fixed electrode piece and the second movable electrode piece;

a first fixed contact point that is capable of being in contact with the movable contact point, the movable contact point moving in a first direction by an electrostatic attractive force between the movable electrode and the first fixed electrode;

a second fixed contact point that is capable of being in contact with the movable contact point, the movable contact point moving in a second direction opposite to the first direction by an electrostatic attractive force between the movable electrode and the second fixed electrode; and an elastic support portion that elastically supports the movable electrode, the movable electrode being capable of moving in the first and second directions.

(2) The switching apparatus according to (1) above, in which the second movable electrode piece faces the third fixed electrode piece with a first distance, and faces the fourth fixed electrode piece with a second distance larger than the first distance in a first state in which the movable contact point is in contact with the first fixed contact point.

(3) The switching apparatus according to (2) above, in which the first movable electrode piece faces the first fixed electrode piece with the first distance, and faces the second fixed electrode piece with the second distance in a second state in which the movable contact point is in contact with the second fixed contact point.

(4) The switching apparatus according to (2) or (3) above, in which the second distance is not more than twice the first distance.

(5) The switching apparatus according to (3) or (4) above, further including a driving circuit that selectively performs a first driving mode and a second driving mode, operation voltage being applied between the movable electrode and the first fixed electrode to switch a state of the movable contact point to the first state in the first driving mode, the operation voltage being not more than 1.4 times pull-in voltage between the movable electrode and the first fixed electrode, operation voltage being applied between the movable electrode and the second fixed electrode to switch the state of the movable contact point to the second state in the second driving mode, the operation voltage being not more than 1.4 times pull-in voltage between the movable electrode and the second fixed electrode.

(6) The switching apparatus according to any one of (1) to (5) above, in which the movable electrode further includes a coupling rod that commonly supports the first and second movable electrode pieces and the movable contact point, the coupling rod extending in parallel with the first and second directions.

(7) The switching apparatus according to (6) above, in which the movable contact point is placed between the first movable electrode piece and the second movable electrode piece, and the elastic support portion is provided to both ends of the coupling rod.

(8) The switching apparatus according to (6) above, in which the movable contact point is provided to both ends of the coupling rod, and the elastic support portion is placed between the first movable electrode piece and the second movable electrode piece.

(9) A switching apparatus, including:

a plurality of switching mechanisms, each of the plurality of switching mechanisms including a movable electrode that includes a first movable electrode piece, a second movable electrode piece, and a movable contact point, a first fixed electrode that includes first and second fixed electrode pieces, the first and second fixed electrode pieces facing each other with the first movable electrode piece disposed between the first and second fixed electrode pieces, the first fixed electrode piece facing the first movable electrode piece with a gap narrower than a gap between the second fixed electrode piece and the first movable electrode piece, a second fixed electrode that includes third and fourth fixed electrode pieces, the third and fourth fixed electrode pieces facing each other with the second movable electrode piece disposed between the third and fourth fixed electrode pieces, the third fixed electrode piece facing the second movable electrode piece with a gap narrower than a gap between the fourth fixed electrode piece and the second movable electrode piece, a first fixed contact point that is capable of being in contact with the movable contact point, the movable contact point moving in a first direction by an electrostatic attractive force between the movable electrode and the first fixed electrode, a second fixed contact point that is capable of being in contact with the movable contact point, the movable contact point moving in a second direction opposite to the first direction by an electrostatic attractive force between the movable electrode and the second fixed electrode, and an elastic support portion that elastically supports the movable electrode, the movable electrode being capable of moving in the first and second directions.

(10) An electronic apparatus, including:

a switching apparatus including a movable electrode that includes a first movable electrode piece, a second movable electrode piece, and a movable contact point, a first fixed electrode that includes first and second fixed electrode pieces, the first and second fixed electrode pieces facing each other with the first movable electrode piece disposed between the first and second fixed electrode pieces, the first fixed electrode piece facing the first movable electrode piece with a gap narrower than a gap between the second fixed electrode piece and the first movable electrode piece, a second fixed electrode that includes third and fourth fixed electrode pieces, the third and fourth fixed electrode pieces facing each other with the second movable electrode piece disposed between the third and fourth fixed electrode pieces, the third fixed electrode piece facing the second movable electrode piece with a gap narrower than a gap between the fourth fixed electrode piece and the second movable electrode piece, a first fixed contact point that is capable of being in contact with the movable contact point, the movable contact point moving in a first direction by an electrostatic attractive force between the movable electrode and the first fixed electrode, a second fixed contact point that is capable of being in contact with the movable contact point, the movable contact point moving in a second direction opposite to the first direction by an electrostatic attractive force between the movable electrode and the second fixed electrode, and an elastic support portion that elastically supports the movable electrode, the movable electrode being capable of moving in the first and second directions.

REFERENCE SIGNS LIST 1, 2, 3 switching apparatus
4 electronic apparatus
10 substrate
21 first fixed electrode
22 second fixed electrode
30 movable electrode
31 first movable electrode piece
32 second movable electrode piece
33 movable contact point
34 coupling rod
41 first fixed contact point
42 second fixed contact point
43 common contact point
50 elastic support portion
60 driving circuit
71, 72 switching mechanism
201 first fixed electrode piece
202 second fixed electrode piece
203 third fixed electrode piece
204 fourth fixed electrode piece

The invention claimed is:

1. A switching apparatus, comprising:
a movable electrode that includes a first movable electrode piece, a second movable electrode piece, and a movable contact point;
a first fixed electrode that includes first and second fixed electrode pieces, the first and second fixed electrode pieces facing each other with the first movable electrode piece disposed between the first and second fixed electrode pieces, the first fixed electrode piece facing the first movable electrode piece with a gap narrower than a gap between the second fixed electrode piece and the first movable electrode piece;
a second fixed electrode that includes third and fourth fixed electrode pieces, the third and fourth fixed electrode pieces facing each other with the second movable electrode piece disposed between the third and fourth fixed electrode pieces, the third fixed electrode piece facing the second movable electrode piece with a gap narrower than a gap between the fourth fixed electrode piece and the second movable electrode piece;
a first fixed contact point that is capable of being in contact with the movable contact point, the movable contact point moving in a first direction by an electrostatic attractive force between the movable electrode and the first fixed electrode;
a second fixed contact point that is capable of being in contact with the movable contact point, the movable contact point moving in a second direction opposite to the first direction by an electrostatic attractive force between the movable electrode and the second fixed electrode;
an elastic support portion that elastically supports the movable electrode, the movable electrode being capable of moving in the first and second directions, wherein:
the second movable electrode piece faces the third fixed electrode piece with a first distance, and faces the fourth fixed electrode piece with a second distance larger than the first distance in a first state in which the movable contact point is in contact with the first fixed contact point,
the first movable electrode piece faces the first fixed electrode piece with the first distance, and faces the second fixed electrode piece with the second distance in a second state in which the movable contact point is in contact with the second fixed contact point; and
a driving circuit that selectively performs a first driving mode and a second driving mode, operation voltage being applied between the movable electrode and the first fixed electrode to switch a state of the movable contact point to the first state in the first driving mode, the operation voltage being not more than 1.4 times pull-in voltage between the movable electrode and the first fixed electrode, operation voltage being applied between the movable electrode and the second fixed electrode to switch the state of the movable contact point to the second state in the second driving mode, the operation voltage being not more than 1.4 times pull-in voltage between the movable electrode and the second fixed electrode.

2. The switching apparatus according to claim 1, wherein the second distance is not more than twice the first distance.

3. The switching apparatus according to claim 1, wherein the movable electrode further includes a coupling rod that commonly supports the first and second movable electrode pieces and the movable contact point, the coupling rod extending in parallel with the first and second directions.

4. The switching apparatus according to claim 3, wherein the movable contact point is placed between the first movable electrode piece and the second movable electrode piece, and
the elastic support portion is provided to both ends of the coupling rod.

5. The switching apparatus according to claim 3, wherein the elastic support portion is placed between the first movable electrode piece and the second movable electrode piece.

6. A switching apparatus, comprising:
a plurality of switching mechanisms, each of the plurality of switching mechanisms including
a movable electrode that includes a first movable electrode piece, a second movable electrode piece, and a movable contact point,
a first fixed electrode that includes first and second fixed electrode pieces, the first and second fixed electrode pieces facing each other with the first movable electrode piece disposed between the first and second fixed electrode pieces, the first fixed electrode piece facing the first movable electrode piece with a gap narrower than a gap between the second fixed electrode piece and the first movable electrode piece,
a second fixed electrode that includes third and fourth fixed electrode pieces, the third and fourth fixed electrode pieces facing each other with the second movable electrode piece disposed between the third and fourth fixed electrode pieces, the third fixed electrode piece facing the second movable electrode piece with a gap narrower than a gap between the fourth fixed electrode piece and the second movable electrode piece,
a first fixed contact point that is capable of being in contact with the movable contact point, the movable contact point moving in a first direction by an electrostatic attractive force between the movable electrode and the first fixed electrode,
a second fixed contact point that is capable of being in contact with the movable contact point, the movable contact point moving in a second direction opposite to the first direction by an electrostatic attractive force between the movable electrode and the second fixed electrode, and
an elastic support portion that elastically supports the movable electrode, the movable electrode being capable of moving in the first and second directions, wherein:
the second movable electrode piece faces the third fixed electrode piece with a first distance, and faces the fourth fixed electrode piece with a second distance larger than the first distance in a first state in which the movable contact point is in contact with the first fixed contact point,
the first movable electrode piece faces the first fixed electrode piece with the first distance, and faces the second fixed electrode piece with the second distance in a second state in which the movable contact point is in contact with the second fixed contact point; and
a driving circuit that selectively performs a first driving mode and a second driving mode, operation voltage being applied between the movable electrode and the first fixed electrode to switch a state of the movable contact point to the first state in the first driving mode, the operation voltage being not more than 1.4 times pull-in voltage between the movable electrode and the first fixed electrode, operation voltage being applied between the movable electrode and the second fixed electrode to switch the state of the movable contact point to the second state in the second driving mode, the operation voltage being not more than 1.4 times pull-in voltage between the movable electrode and the second fixed electrode.

7. The switching apparatus according to claim 6, wherein the second distance is not more than twice the first distance.

8. The switching apparatus according to claim 6, wherein the movable electrode further includes a coupling rod that commonly supports the first and second movable electrode pieces and the movable contact point, the coupling rod extending in parallel with the first and second directions.

9. The switching apparatus according to claim 8, wherein the movable contact point is placed between the first movable electrode piece and the second movable electrode piece, and
the elastic support portion is provided to both ends of the coupling rod.

10. The switching apparatus according to claim 8, wherein
the elastic support portion is placed between the first movable electrode piece and the second movable electrode piece.

11. An electronic apparatus, comprising:
a switching apparatus including
a movable electrode that includes a first movable electrode piece, a second movable electrode piece, and a movable contact point,
a first fixed electrode that includes first and second fixed electrode pieces, the first and second fixed electrode pieces facing each other with the first movable electrode piece disposed between the first and second fixed electrode pieces, the first fixed electrode piece facing the first movable electrode piece with a gap narrower than a gap between the second fixed electrode piece and the first movable electrode piece,
a second fixed electrode that includes third and fourth fixed electrode pieces, the third and fourth fixed electrode pieces facing each other with the second movable electrode piece disposed between the third and fourth fixed electrode pieces, the third fixed electrode piece facing the second movable electrode piece with a gap narrower than a gap between the fourth fixed electrode piece and the second movable electrode piece,
a first fixed contact point that is capable of being in contact with the movable contact point, the movable contact point moving in a first direction by an electrostatic attractive force between the movable electrode and the first fixed electrode,
a second fixed contact point that is capable of being in contact with the movable contact point, the movable contact point moving in a second direction opposite to the first direction by an electrostatic attractive force between the movable electrode and the second fixed electrode, and
an elastic support portion that elastically supports the movable electrode, the movable electrode being capable of moving in the first and second directions, wherein:
the second movable electrode piece faces the third fixed electrode piece with a first distance, and faces the fourth fixed electrode piece with a second distance larger than the first distance in a first state in which the movable contact point is in contact with the first fixed contact point,
the first movable electrode piece faces the first fixed electrode piece with the first distance, and faces the second fixed electrode piece with the second distance in a second state in which the movable contact point is in contact with the second fixed contact point; and
a driving circuit that selectively performs a first driving mode and a second driving mode, operation voltage being applied between the movable electrode and the first fixed electrode to switch a state of the movable contact point to the first state in the first driving mode, the operation voltage being not more than 1.4 times pull-in voltage between the movable electrode and the first fixed electrode, operation voltage being applied between the movable electrode and the second fixed electrode to switch the state of the movable contact point to the second state in the second driving mode, the operation voltage being not more than 1.4 times pull-in voltage between the movable electrode and the second fixed electrode.

12. The switching apparatus according to claim 11, wherein
the second distance is not more than twice the first distance.

13. The switching apparatus according to claim 11, wherein
the movable electrode further includes a coupling rod that commonly supports the first and second movable electrode pieces and the movable contact point, the coupling rod extending in parallel with the first and second directions.

14. The switching apparatus according to claim 13, wherein
- the movable contact point is placed between the first movable electrode piece and the second movable electrode piece, and
- the elastic support portion is provided to both ends of the coupling rod.

15. The switching apparatus according to claim 13, wherein
- the elastic support portion is placed between the first movable electrode piece and the second movable electrode piece.

\* \* \* \* \*